United States Patent
Brintzinger et al.

(10) Patent No.: US 7,393,782 B2
(45) Date of Patent: Jul. 1, 2008

(54) PROCESS FOR PRODUCING LAYER STRUCTURES FOR SIGNAL DISTRIBUTION

(75) Inventors: Axel Brintzinger, Dresden (DE); Octavio Trovarelli, Dresden (DE); Wolfgang Leiberg, Dresden (DE)

(73) Assignee: Infineon Technologies AG, Munich (DE)

( * ) Notice: Subject to any disclaimer, the term of this patent is extended or adjusted under 35 U.S.C. 154(b) by 364 days.

(21) Appl. No.: 11/051,548

(22) Filed: Feb. 4, 2005

(65) Prior Publication Data

US 2005/0191837 A1  Sep. 1, 2005

(30) Foreign Application Priority Data

Feb. 4, 2004  (DE) .................. 10 2004 005 645

(51) Int. Cl.
*H01L 21/44* (2006.01)
(52) U.S. Cl. ............... 438/677; 257/774; 257/E23.161; 257/E21.171; 257/E21.175; 438/678
(58) Field of Classification Search ................. 438/677, 438/678, 725, 675; 257/E21.171, E21.175, 257/E21.479, E21.492, E23.161, 744
See application file for complete search history.

(56) References Cited

U.S. PATENT DOCUMENTS

| 5,468,595 | A | 11/1995 | Livesay |
| 6,018,179 | A | 1/2000 | Gardner et al. |
| 6,524,916 | B1 * | 2/2003 | Scholer et al. ............... 438/270 |
| 2004/0185683 | A1 * | 9/2004 | Nakamura .................. 438/957 |
| 2006/0009020 | A1 * | 1/2006 | Tanaka ....................... 438/597 |

* cited by examiner

*Primary Examiner*—Caridad M Everhart
(74) *Attorney, Agent, or Firm*—Slater & Matsil, L.L.P.

(57) ABSTRACT

Structures for signal distribution are produced by applying a metallic seed layer over a semiconductor body. An insulating layer is applied over the metallic seed layer and openings in the insulating layer are produced by photolithographic patterning of the insulating layer. Each opening in the insulating layer is trapezoidal in cross section such that an upper portion of the insulating layer is wider than a lower portion of the insulating layer. A conductor is selectively formed over exposed portions of the metallic seed layer. After selectively forming the conductor, the insulating layer is anisotropically etched such that portions of the insulating layer abutting sidewalls of the conductor remain. Alternatively, a second insulating layer can be formed and anisotropically etched.

25 Claims, 3 Drawing Sheets

PROCESS FOR PRODUCING LAYER STRUCTURES FOR SIGNAL DISTRIBUTION

This application claims priority to German Patent Application 10 2004 005 645.5, which was filed Feb. 4, 2004, and is incorporated herein by reference.

TECHNICAL FIELD

The invention relates to a process for producing layer structures for signal distribution.

BACKGROUND

In modern semiconductor technology, it is customary for terminals placed on a semiconductor wafer to be diverted to other terminals by metal interconnects. This allows or simplifies external connection.

The metal interconnects are applied to the semiconductor wafer in a dedicated plane and consist of coated metal, the metals copper, nickel and gold, in this order, usually being used.

To apply the metal interconnects, the semiconductor wafer is coated with a copper seed layer. Then, a photoresist layer is applied and patterned by means of a photolithographic process, thereby forming a photomask for the subsequent electrolysis process.

The openings, which are formed, are then filled with layers of metal by means of an electrolysis process. After the photoresist layer has been removed and the copper seed layer required for the electrolysis process has been etched, the layer structures for signal distribution are what remain.

It is customary for the upper layer of the layer structures to be a precious metal, such as for example gold, with the result that the surfaces of the layer structures are as far as possible protected from environmental influences. However, the base metals of the layer structure are also accessible at the side faces.

This aspect has proven to be a problem, since oxidation and corrosion processes attack sidewalls of the layer structures, thereby reducing the service life of the layer structures and also the reliability of the circuit as a whole.

SUMMARY OF THE INVENTION

The invention is therefore based on the object of providing a process for producing layer structures for signal distribution, which avoids corrosion or oxidation at the sidewalls and thereby increases the reliability of the circuit.

According to a first aspect of the invention, the object is achieved by virtue of the fact that, after the first photoresist layer has been removed, a second photoresist layer is applied, which comprises positive photoresist and is completely exposed after it has been applied.

For production reasons, the layer structures for signal distribution acquire the shape of an isosceles trapezoid in cross section, with the longer of the parallel sides located at the surface of the layer structure. Therefore, there is an overhang from the top layer to the base of the structure.

If the structure is then exposed vertically from above, as is the case in the process according to the invention, the overhang throws a shadow, and consequently the sides of the layer structure inevitably remain unexposed.

If a positive photoresist is then used, as described in the process according to the invention, only the unexposed locations are activated. Regions that are in the shadow of the exposure are therefore retained.

The result of this effect is that at the end of the process according to the invention a photoresist layer remains at the sides of the layer structure. If an annealing process then follows the exposure and developing, the remaining parts of the photoresist layer are completely cured.

This hardened photoresist layer provides effective protection against the effects of environmental influences and therefore prevents corrosion of the metals used in the layer structure.

In another configuration of the process according to the invention, the copper seed layer, which has been applied, is removed by etching prior to the application of the second photoresist layer.

Furthermore, it is of no importance to the process according to the invention whether a positive or negative photoresist is used to produce the layer structure for signal distribution. Therefore, positive photoresist can be used in one variant of the process according to the invention, and negative photoresist can be used in another variant of the process according to the invention, depending on what proves technologically expedient.

In another aspect of the invention, the positive photoresist that is already used to produce the layer structures is exposed a further, second time. This exposure is usually carried out over the entire semiconductor wafer and without an exposure mask.

In this case too, the favorable geometry of the layer structures forms a shadow at the sides of the layer structures. After the exposed part of the photoresist has been removed, therefore, a protective layer remains at the sides of the layer structures and, after it has been cured by an annealing process, prevents the harmful influences of the environment on the metals and therefore protects the layer structures from the effects of corrosion and oxidation. In this context, the invention exploits the fact that with a positive photoresist the exposed parts are removed, as was the case for the openings in the first exposure step.

BRIEF DESCRIPTION OF THE DRAWINGS

The invention is to be explained in more detail below on the basis of an exemplary embodiment. In the associated drawings.

Figure 1:
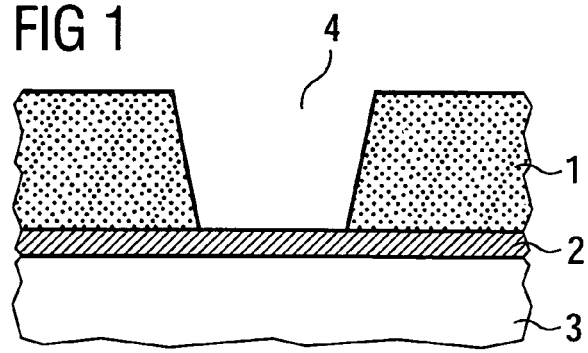
FIG. 1 shows a patterned photomask with an opening which is trapezoidal in cross section.

The following list of reference symbols can be used in conjunction with the figures 1 Patterned insulating layer
2 Conductive layer
3 Semiconductor wafer
4 Opening in the photoresist layer
5 Layer structure for signal distribution
6 Insulating layer, e.g., formed from positive photoresist
7 Shadow region
8 Remaining portion of the insulating layer

DETAILED DESCRIPTION OF ILLUSTRATIVE EMBODIMENTS

The drawings illustrate two different forms of the process according to the invention for producing layer structures for signal distribution. FIG. 1 to FIG. 7 show a first process according to the invention, and FIG. 8 to FIG. 12 show a second process according to the invention.

As illustrated in FIG. 1, conductive layer 2, such as a copper seed layer, is applied to a semiconductor wafer 3. An insulating layer 1, such as a positive or negative photoresist, is formed over the conductive layer 2. The insulating layer can alternatively be an insulating layer such as an oxide, a nitride or an oxynitride.

The insulating layer 1 is then patterned by a photolithographic process. The openings 4 which are formed are approximately in the shape of an isosceles trapezoid, with the longer of the parallel sides located at the top side of the opening 4.

Figure 2:
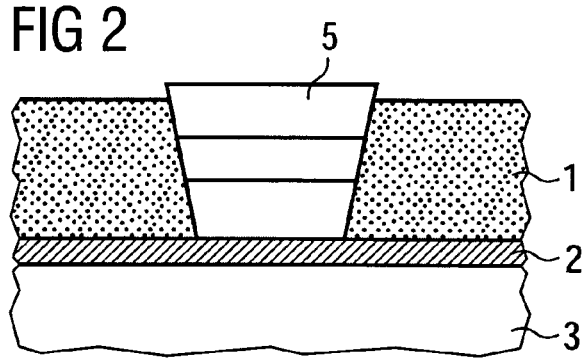
FIG. 2 shows the patterned photomask with filled opening following an electrolysis process (prior art)
Figure 3:
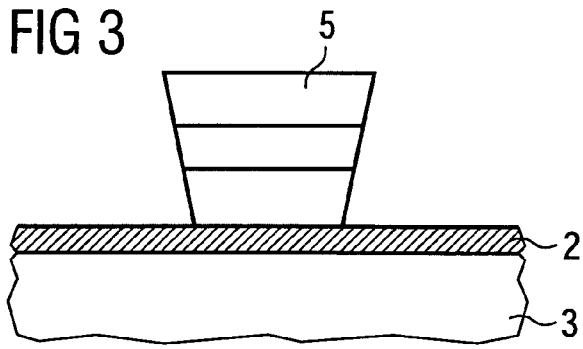
FIG. 3 shows a layer structure for signal distribution, after removal of the photoresist layer.

A conductor 5 is then formed. For example, an electrolytic process can be carried out by means of a voltage applied to the conductive layer 2 so that the openings 4 are filled with layers of metal. The metal of the top layer is usually a passivating precious metal layer, for example of gold. The result of this process is illustrated in FIG. 2. The lower layers are produced from electrically conductive material, such as copper or nickel. As illustrated in FIG. 3, following removal of the insulating layer 1 are accessible via the sidewalls of the layer structure 5. This entails the problem of the freely accessible base metals being exposed to the effect of corrosion or oxidation.

Figure 4:
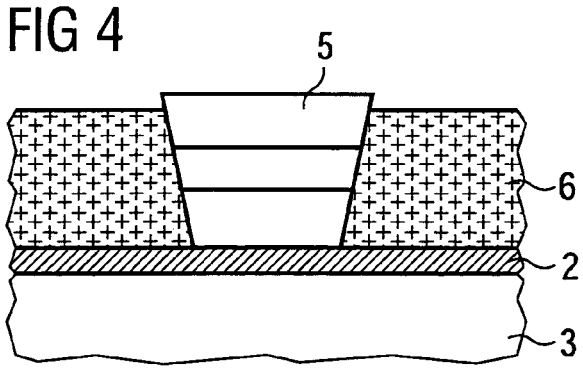
FIG. 4 shows the layer structure for signal distribution following application according to the invention of a second positive photoresist layer.
Figure 5:
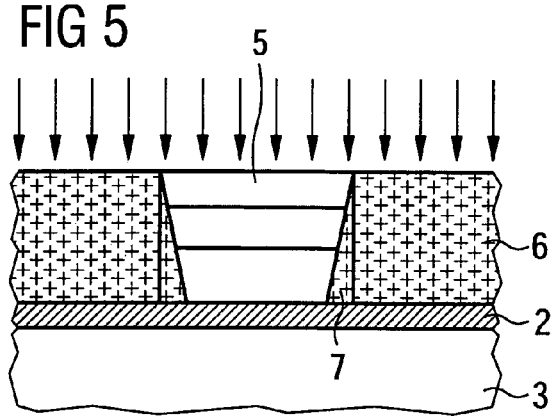
FIG. 5 shows the layer structure for signal distribution during exposure according to the invention in the positive photoresist layer.
Figure 6:
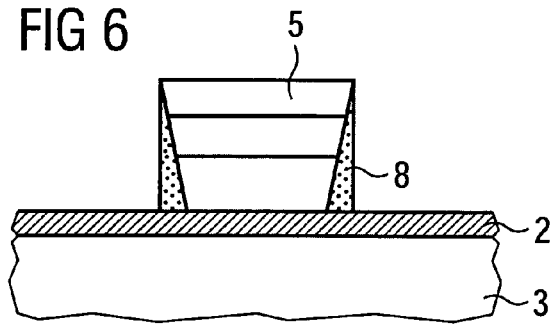
FIG. 6 shows the layer structure for signal distribution following removal of the positive photoresist layer.
Figure 7:
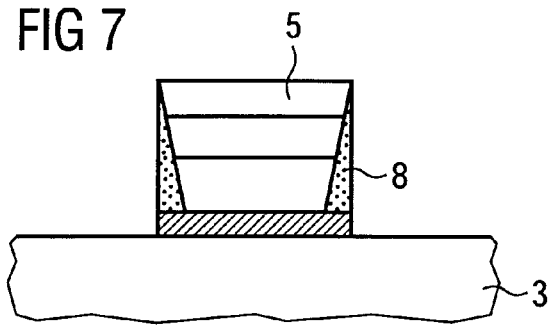
FIG. 7 shows the layer structure for signal distribution following the etching of the copper seed layer.

According to a first aspect of the invention, this problem is solved by the fact that another insulating layer 6 is applied, preferably comprising positive photoresist. This positive photoresist 6, illustrated in FIG. 4, is exposed in a further process step, as illustrated in FIG. 5. On account of the radiation impinging vertically from above and the geometry of the layer structure, shadow regions 7 which are not exposed are formed. Since the resist used is positive photoresist, in the subsequent stripping process only the exposed parts of the photoresist are removed. As a result, the unexposed parts of the photoresist 8 remain in place at the side faces of the layer structure 5, as illustrated in FIG. 6. Alternatively, any anisotropic removal of the portions of insulating layer 6 that do not underlie the overhang of conductor 5 can be performed.

After annealing of the photoresist residues 8 and etching of the conductive layer 2, a laterally sealed layer structure for signal distribution then remains.

Figure 8:
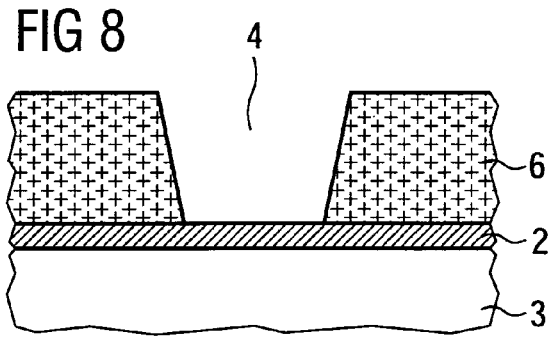
FIG. 8 shows a patterned photomask formed from positive photoresist with an opening which is trapezoidal in cross section.
Figure 9:
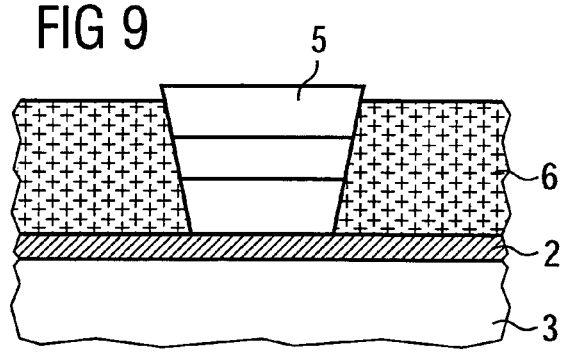
FIG. 9 shows the patterned photomask with filled opening following an electrolysis process.
Figure 10:
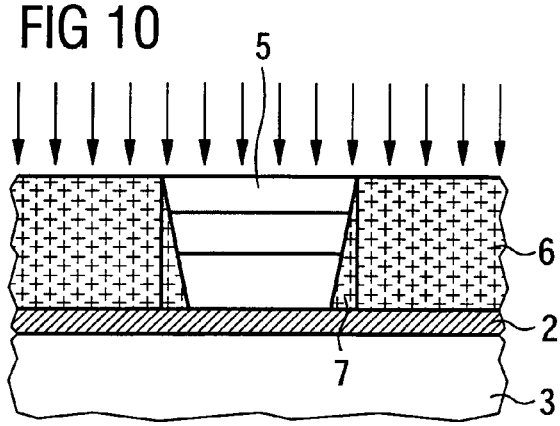
FIG. 10 shows the layer structure for signal distribution during a second exposure step according to the invention in the positive photoresist layer.

In a second process according to the invention, the photoresist layer for applying the layer structures for signal distribution is formed from positive photoresist, as illustrated in FIG. 8. After the positive photoresist layer 6 has been patterned in a photolithographic process, an opening 4, which is approximately in the shape of an isosceles trapezoid is formed, with the longer of the parallel sides located at the top side of the opening. Once again, the insulating layer 6 can alternatively comprise other materials, such as oxide, nitride or oxynitride.

Figure 11:
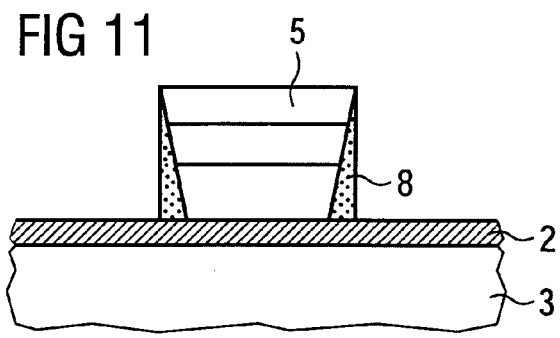
FIG. 11 shows the layer structure for signal distribution following removal of the positive photoresist layer.
Figure 12:
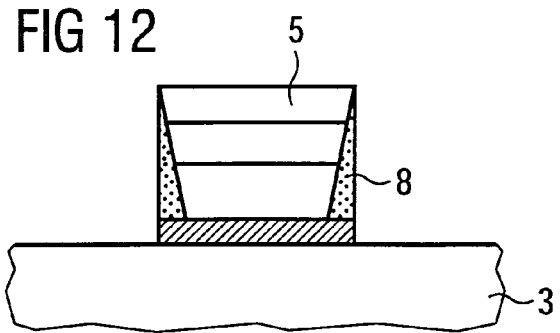
FIG. 12 shows the layer structure for signal distribution following the etching of the copper seed layer.

The application of a voltage to the conductive layer 2 then causes an electrolysis process to take place, with the layer structure for signal distribution 5 being applied. The result of this process step is a layer structure in accordance with FIG. 9, as has already been described in FIG. 2. After the layer structure 5 has been applied, the positive photoresist 6 that remains is then exposed again. In the process, the trapezoidal geometry of the layer structure forms a shadow 7, illustrated in FIG. 10. The photoresist regions in this region are not exposed and are therefore not removed during the subsequent stripping process. As illustrated in FIG. 11, therefore, what remains is a layer structure 5 enclosed in photoresist 8. After the exposed parts of the photoresist have been removed, an annealing process is carried out, curing the photoresist residues 8. After subsequent etching of the conductive layer 2, the end result is as shown in FIG. 12, with the side faces of the layer structure for signal distribution protected by the hardened photoresist.

What is claimed is:

1. A process for producing layer structures for signal distribution, the process comprising:
    applying a metallic seed layer over a semiconductor body;
    applying a first photoresist layer over the metallic seed layer;
    producing openings, which are trapezoidal in cross section, in the first photoresist layer by photolithographic patterning of the first photoresist layer;
    electrolytically producing layer structures for signal distribution in the openings in the first photoresist layer;
    removing the first photoresist layer;
    after the first photoresist layer has been removed, applying a second photoresist layer of positive photoresist;
    exposing the second photoresist layer; and
    removing exposed portions of the second photoresist layer.

2. The process as claimed in claim 1, wherein portions of the metallic seed layer are removed by an etching process prior to applying the second photoresist layer.

3. The process as claimed in claim 1, wherein applying the first photoresist layer comprises applying a negative photoresist.

4. The process as claimed in claim 1, wherein applying the first photoresist layer comprises applying a positive photoresist.

5. The process as claimed in claim 1, wherein remaining portions of the second photoresist layer, after the exposure and removal, are cured in a subsequent annealing process.

6. A process for producing layer structures for signal distribution, the process comprising:
    applying a metallic seed layer over a semiconductor body;
    applying an insulating layer over the metallic seed layer;
    producing openings in the insulating layer by photolithographic patterning of the insulating layer, each opening in the insulating layer being trapezoidal in cross section such that an upper portion of the opening is wider than a lower portion of the opening;
    selectively forming a conductor over exposed portions of the metallic seed layer, the conductor producing layer structures for signal distribution in the openings in the insulating layer;

after selectively forming the conductor, anisotropically etching the insulating layer such that portions of the insulating layer abutting sidewalls of the conductor remain.

7. The process as claimed in claim 6, wherein applying an insulating layer comprises applying a positive photoresist.

8. The process as claimed in claim 7, wherein anisotropically etching the insulating layer comprises:
exposing the positive photoresist after selectively forming the conductor, the exposing step not exposing remaining portions of the positive photoresist, the remaining portions underlying the conductor; and
removing exposed portions of the positive photoresist.

9. The process as claimed in claim 8, wherein, after removing the exposed portions of the positive photoresist, the remaining parts of the photoresist layer are cured in an annealing process step.

10. The process as claimed in claim 8 and further comprising removing portions of the metallic seed layer after the exposed portions of the positive photoresist are removed.

11. The process as claimed in claim 10 wherein the metallic seed layer comprises a copper seed layer and wherein the conductor comprises copper.

12. The process as claimed in claim 11 where forming a conductor further comprises applying nickel and gold over the copper.

13. A process for producing layer structures for signal distribution, the process comprising:
forming a conductive layer over a semiconductor body;
applying a first insulating layer over the conductive layer;
producing openings in the first insulating layer by photolithographically patterning the first insulating layer, each opening in the insulating layer being trapezoidal in cross section such that an upper portion of the insulating layer is wider than a lower portion of the insulating layer;
forming a conductor within the openings and electrically contacting the conductive layer, the conductor being trapezoidal in cross section such that an upper portion of the conductor is wider than a lower portion of the conductor and such that the conductor includes sloping sidewalls;
removing the first insulating layer;
after removing the first insulating layer, forming a second insulating layer over the semiconductor body including along the sloping sidewalls of the conductor; and
anisotropically etching the second insulating layer such that portions of the insulating layer abutting the sloping sidewalls of the conductor remain.

14. The process as claimed in claim 13, and further comprising removing portions of the metallic seed layer by an etching process prior to forming the second insulating layer.

15. The process as claimed in claim 13, wherein:
forming a conductive layer over a semiconductor body comprises applying a metallic seed layer; and
wherein forming a conductor comprises electrolytically producing layer structures for signal distribution in the openings in the insulating layer.

16. The process as claimed in claim 15, wherein the metallic seed layer comprises a copper seed layer and wherein the conductor comprises copper.

17. The process as claimed in claim 16, wherein forming a conductor further comprises applying nickel and gold over the copper.

18. The process as claimed in claim 13, wherein the second insulating layer comprises a positive photoresist, wherein anisotropically etching the second insulating layer comprises:
exposing the positive photoresist after forming the conductor, the exposing step not exposing portions of the positive photoresist underlying the conductor; and
removing exposed portions of the positive photoresist.

19. The process as claimed in claim 18, wherein the first insulating layer comprises a photoresist layer.

20. The process as claimed in claim 18, and further comprising curing portions of the positive photoresist that are not removed during the step of removing exposed portions of the positive photoresist, curing being performed in an annealing process step performed after the second removing step.

21. A process for producing layer structures for signal distribution, the process comprising:
applying a metallic seed layer over a semiconductor body;
applying an insulating layer over the metallic seed layer, wherein applying the insulating layer comprises applying a positive photoresist;
producing openings in the insulating layer by photolithographic patterning of the insulating layer, each opening in the insulating layer being trapezoidal in cross section such that an upper portion of the insulating layer is wider than a lower portion of the insulating layer;
selectively forming a conductor over exposed portions of the metallic seed layer, the conductor producing layer structures for signal distribution in the openings in the insulating layer;
after selectively forming the conductor, anisotropically etching the insulating layer such that portions of the insulating layer abutting sidewalls of the conductor remain, wherein anisotropically etching the insulating layer comprises:
exposing the positive photoresist after selectively forming the conductor, the exposing step not exposing remaining portions of the positive photoresist, the remaining portions underlying the conductor; and
removing exposed portions of the positive photoresist.

22. The process as claimed in claim 21, wherein, after removing the exposed portions of the positive photoresist, the remaining parts of the positive photoresist are cured in an annealing process step.

23. The process as claimed in claim 21, further comprising removing portions of the metallic seed layer after the exposed portions of the positive photoresist are removed.

24. The process as claimed in claim 23, wherein the metallic seed layer comprises a copper seed layer and wherein the conductor comprises copper.

25. The process as claimed in claim 24, wherein forming the conductor further comprises applying nickel and gold over the copper.

* * * * *